US012062676B2

(12) United States Patent
Park et al.

(10) Patent No.: US 12,062,676 B2
(45) Date of Patent: Aug. 13, 2024

(54) IMAGE SENSOR WITH VARYING GRID WIDTH

(71) Applicant: SAMSUNG ELECTRONICS CO., LTD., Suwon-si (KR)

(72) Inventors: Jun Sung Park, Hwaseong-si (KR); Jin Ho Kim, Seoul (KR); Yun Ki Lee, Hwaseong-si (KR); Bum Suk Kim, Hwaseong-si (KR); Jung-Saeng Kim, Seoul (KR); Dong Kyu Lee, Suwon-si (KR); Tae Sung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 17/464,655

(22) Filed: Sep. 1, 2021

(65) Prior Publication Data
US 2022/0190017 A1  Jun. 16, 2022

(30) Foreign Application Priority Data

Dec. 11, 2020  (KR) .................... 10-2020-0173570

(51) Int. Cl.
   *H01L 27/00*   (2006.01)
   *H01L 27/146*  (2006.01)
   *H04N 25/79*   (2023.01)

(52) U.S. Cl.
   CPC .. *H01L 27/14621* (2013.01); *H01L 27/14627* (2013.01); *H01L 27/1463* (2013.01);
   (Continued)

(58) Field of Classification Search
   CPC ......... H01L 27/14621; H01L 27/14627; H01L 27/1463; H01L 27/1464; H01L 27/14645
   See application file for complete search history.

(56) References Cited

U.S. PATENT DOCUMENTS 9,634,049 B2    4/2017  Chang et al.
10,121,809 B2  11/2018  Pang et al.
(Continued)

FOREIGN PATENT DOCUMENTS

CN    110034145 A  *  7/2019
CN    110634899       12/2019
KR    10-2019-0017197  2/2019

*Primary Examiner* — Reema Patel
(74) *Attorney, Agent, or Firm* — F. CHAU & ASSOCIATES, LLC

(57) ABSTRACT

An image sensor in which a shading phenomenon is decreased and the quality is increased is provided. The image sensor includes a light-receiving region including a plurality of unit pixels. The image sensor further includes a first region with unit pixels adjacent to a center of the light-receiving region, and a second region with the unit pixels spaced apart from the center of the light-receiving region. In both regions, a plurality of color filters corresponding to the plurality of unit pixels is disposed on a first face of the substrate, as well as a grid pattern interposed between the plurality of color filters defining boundaries between the unit pixels. A width of the grid pattern in the second region is greater than a width of the grid pattern in the first region, thereby adjusting light receiving areas near the edge of the image sensor to correct for a shading phenomenon.

15 Claims, 15 Drawing Sheets

(52) U.S. Cl.
CPC .... *H01L 27/14636* (2013.01); *H01L 27/1464* (2013.01); *H01L 27/14645* (2013.01); *H04N 25/79* (2023.01)

(56) References Cited

U.S. PATENT DOCUMENTS 10,566,365 B2    2/2020   Chen et al.
10,651,010 B2    5/2020   Platzgummer et al.

* cited by examiner

IMAGE SENSOR WITH VARYING GRID WIDTH

CROSS-REFERENCE TO RELATED APPLICATION

This application claims priority under 35 USC § 119 to Korean Patent Application No. 10-2020-0173570 filed on Dec. 11, 2020 in the Korean Intellectual Property Office, the disclosure of which is incorporated by reference herein in its entirety.

TECHNICAL FIELD

The present disclosure relates to an image sensor. More specifically, the present disclosure relates to an image sensor with a varying grid width.

DISCUSSION OF THE RELATED ART

In an electronic device, an image sensor is a semiconductor component that can convert optical information into electrical signals. Types of image sensors include charge coupled device (CCD) image sensors and complementary metal-oxide semiconductor (CMOS) image sensors.

The image sensor may be provided in a package. For example, the package may be configured as a structure that protects the image sensor and allows light to enter a photo receiving surface or a sensing region of the image sensor.

In some conventional image sensors, captured images may suffer quality loss near the edges of the frame. For example, there may be a loss of brightness near the edges of the image, or colors may not be accurately represented. Accordingly, a backside illumination (BSI) image sensor, in which incident light is radiated through a back side of a semiconductor substrate so that pixels formed in the image sensor have increased light reception efficiency and sensitivity, has been studied.

SUMMARY

Aspects of the present disclosure provide an image sensor in which a shading phenomenon is reduced and the quality is increased.

According to an aspect of the present disclosure, an image sensor includes a light-receiving region including a plurality of unit pixels. The image sensor further includes a first region including unit pixels adjacent to a center of the light-receiving region, and a second region including unit pixels spaced apart from the center of the light-receiving region, where both the first region and the second region includes a substrate which includes a first face on which light is incident, and a second face opposite to the first face, a plurality of photoelectric conversion layers disposed in the substrate and corresponding to the plurality of unit pixels, a pixel separation pattern extending from the second face to the first face in the substrate separating the plurality of photoelectric conversion layers, a plurality of color filters disposed on the first face of the substrate corresponding to the plurality of unit pixels, and a grid pattern disposed on the first face of the substrate and interposed between the plurality of color filters, where a width of the grid pattern of the second region is greater than a width of the grid pattern of the first region.

According to another aspect of the present disclosure, an image sensor includes a light-receiving region including a plurality of unit pixels. The image sensor further comprises a first region including unit pixels adjacent to a center of the light-receiving region, and a second region including unit pixels spaced apart from the center of the light-receiving region, wherein each of the first region and the second region includes a first color pattern, and a second color pattern adjacent to and different from the first color pattern, and wherein a light-receiving area of the first color pattern of the second region is smaller than a light-receiving area of the first color pattern of the first region, and is further smaller than a light-receiving area of the second color pattern of the second region.

According to another aspect of the present disclosure, an image sensor includes a substrate which includes a first face on which light is incident, and a second face opposite to the first face, a plurality of unit pixels each including a photoelectric conversion layer in the substrate, a pixel separation pattern disposed in the substrate which separates the plurality of the unit pixels, a plurality of color filters disposed on the first face of the substrate and arranged in a Bayer pattern including a red color filter, a green color filter, and a blue color filter, and a grid pattern disposed on the first face of the substrate and interposed between the plurality of color filters, wherein a light-receiving area of the red color filter and a light-receiving area of the blue color filter are smaller than a light-receiving area of the green color filter.

Aspects of the present disclosure are not necessarily restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof while referring to the attached drawings, in which.

DETAILED DESCRIPTION OF THE EMBODIMENTS

Figure 1:
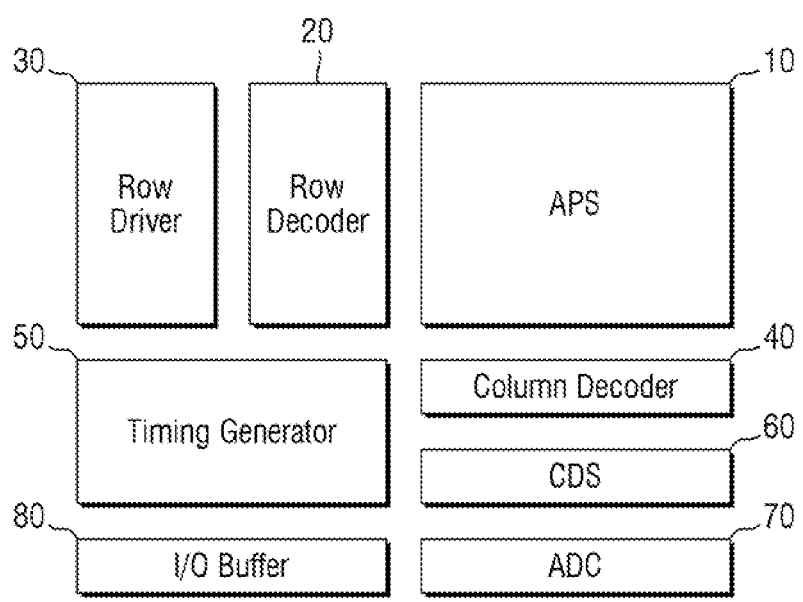
FIG. 1 is an example block diagram of an image sensor according to some embodiments.

Hereinafter, image sensors according to example embodiments will be described referring to FIGS. 1 to 15. Like reference symbols in the drawings may denote like elements, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

As used herein, to/from "the outside" may describe anything going to or coming from the outside of the currently described embodiment, or if explicitly stated, outside from the currently described component. Further, as used herein, "from the planar viewpoint" or "in a plan view" may refer to either a top-down view or a bottom-up view, as determined by the context of the description and the associated Figure.

Figure 2:
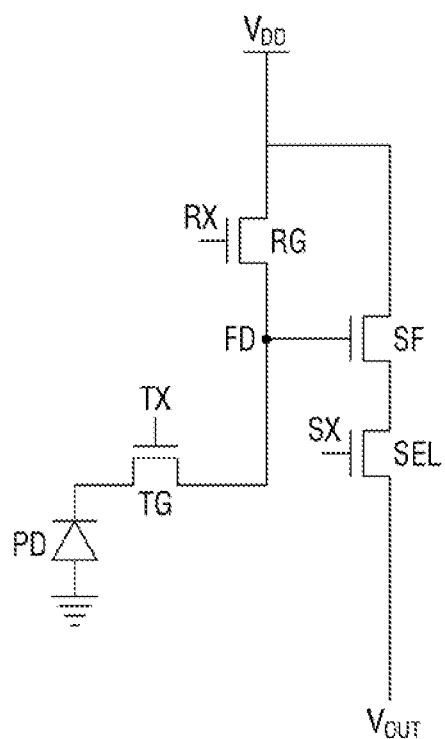
FIG. 2 is an example circuit diagram of a unit pixel of the image sensor according to some embodiments.

FIG. 1 is an example block diagram of an image sensor according to some embodiments. FIG. 2 is an example circuit diagram of a unit pixel of the image sensor according to some embodiments.

Referring to FIG. 1, an image sensor according to some embodiments includes an active pixel sensor array (APS) 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 includes a plurality of unit pixels arranged two-dimensionally, and may convert an optical signal into an electric signal. The active pixel sensor array 10 may be driven by a plurality of drive signals from the row driver 30. The row driver 30 may provide, for example, a pixel selection signal, a reset signal, and a charge transfer signal. Also, the electrical signal converted by the active pixel sensor array 10 may be provided to the correlated double sampler 60.

The row driver 30 may provide a large number of drive signals for driving a plurality of unit pixels to the active pixel sensor array 10. The timing, number, and routing of the drive signals may be at least partially dependent on processing from the row decoder 20. When the unit pixels are arranged in a matrix including rows and columns, the drive signals may be provided for each row.

The timing generator 50 may provide a timing signal and a control signal to the row decoder 20 and the column decoder 40.

The correlated double sampler (CDS) 60 may receive, hold, and sample the electrical signals generated by the active pixel sensor array 10. The correlated double sampler 60 may doubly sample a specific noise level and a signal level from to the electrical signal, and output a difference level corresponding to a difference between the noise level and the signal level.

The analog-to-digital converter (ADC) 70 may convert the analog signal corresponding to the difference level output from the correlated double sampler 60 into a digital signal, and output the digital signal.

The I/O buffer 80 latches the digital signal, and the latched signal may be sequentially output to a video signal processing unit depending on the decoding result from the column decoder 40.

Referring to FIG. 2, each unit pixel may include a photoelectric conversion element PD, a transfer transistor TG, a floating diffusion region FD, a reset transistor RG, a source follower transistor SF, and a selection transistor SEL.

The photoelectric conversion element PD may generate electric charge in proportion to an amount of light incident onto the image sensor from the outside. The photoelectric conversion element PD may be coupled with the transfer transistor TG which may transfer the generated and accumulated electric charge to the floating diffusion region FD. Since the floating diffusion region FD converts the electric charge into a voltage and has a parasitic capacitance, the electric charge may be accumulatively stored.

One end of the transfer transistor TG may be connected to the photoelectric conversion element PD, and the other end of the transfer transistor TG may be connected to the floating diffusion region FD. The transfer transistor TG may include a transistor driven by a predetermined bias (e.g., a transfer signal TX). That is, the transfer transistor TG may transfer the electric charge generated from the photoelectric conversion element PD to the floating diffusion region FD according to the transfer signal TX.

The source follower transistor SF may amplify a change in electrical potential of the floating diffusion region FD to which the electric charge is transferred from the photoelectric conversion element PD, and output it to an output line $V_{OUT}$. When the source follower transistor SF is turned on, a predetermined electrical potential provided to a drain of the source follower transistor SF (for example, a power supply voltage $V_{DD}$) may be transferred to the drain region of the selection transistor SEL.

The selection transistor SEL may select a unit pixel to be read on a row basis. The selection transistor SEL may include a transistor that is driven by a selection line that applies a predetermined bias (e.g., a row selection signal SX).

The reset transistor RG may periodically reset the floating diffusion region FD. The reset transistor RG may include a transistor that is driven by a reset line that applies a predetermined bias (e.g., a reset signal RX). When the reset transistor RG is turned on by the reset signal RX, a predetermined electrical potential provided to the drain of the reset transistor RG (for example, the power supply voltage $V_{DD}$) may be transferred to the floating diffusion region FD.

Figure 3:
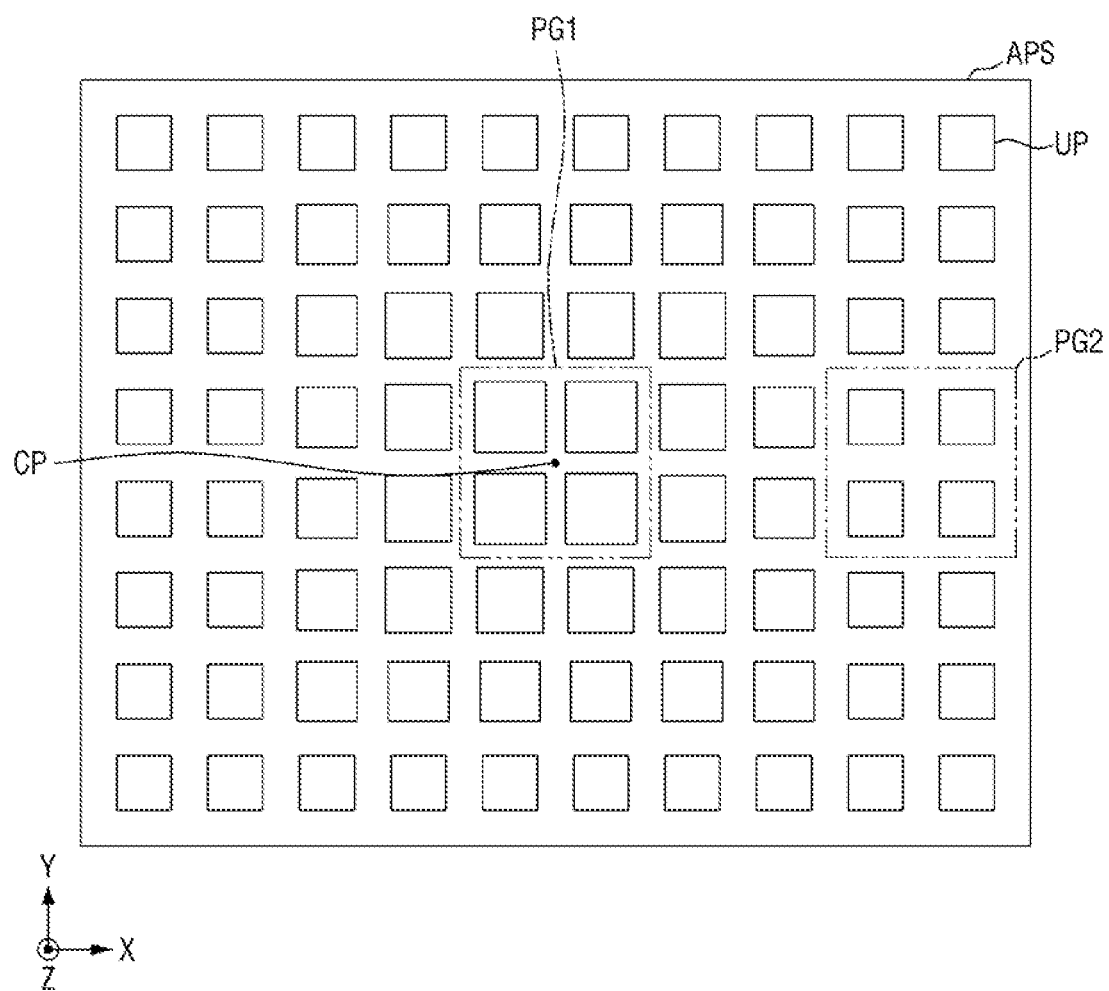
FIG. 3 is a schematic layout view of a light-receiving region of the image sensor according to some embodiments.
Figure 4:
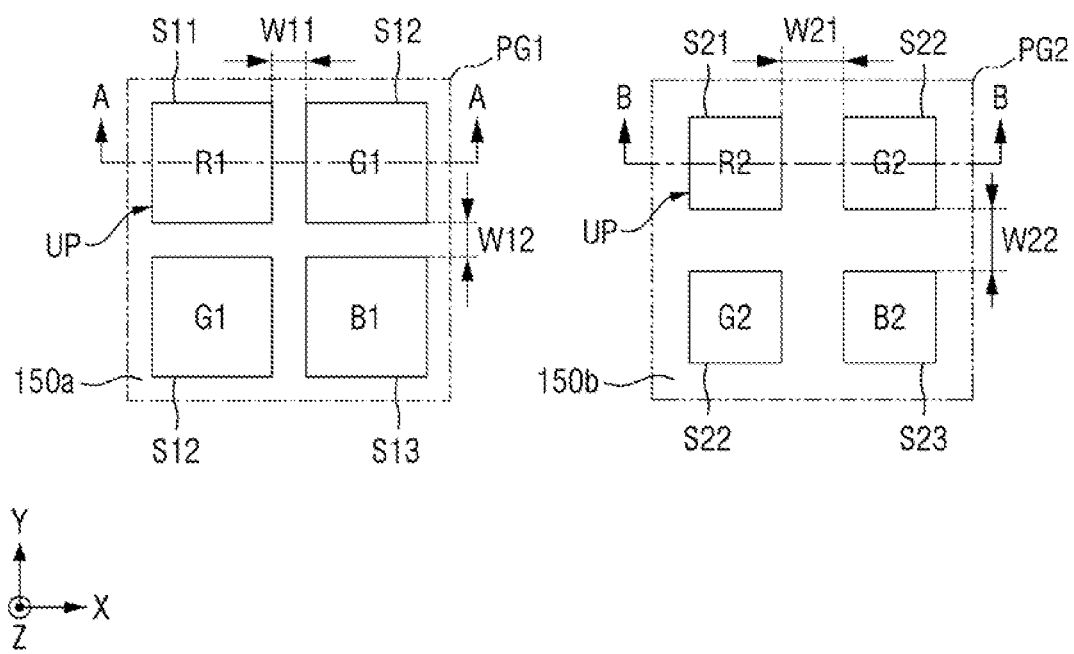
FIG. 4 is a partial layout view of a first region and a second region of FIG. 3.
Figure 5:
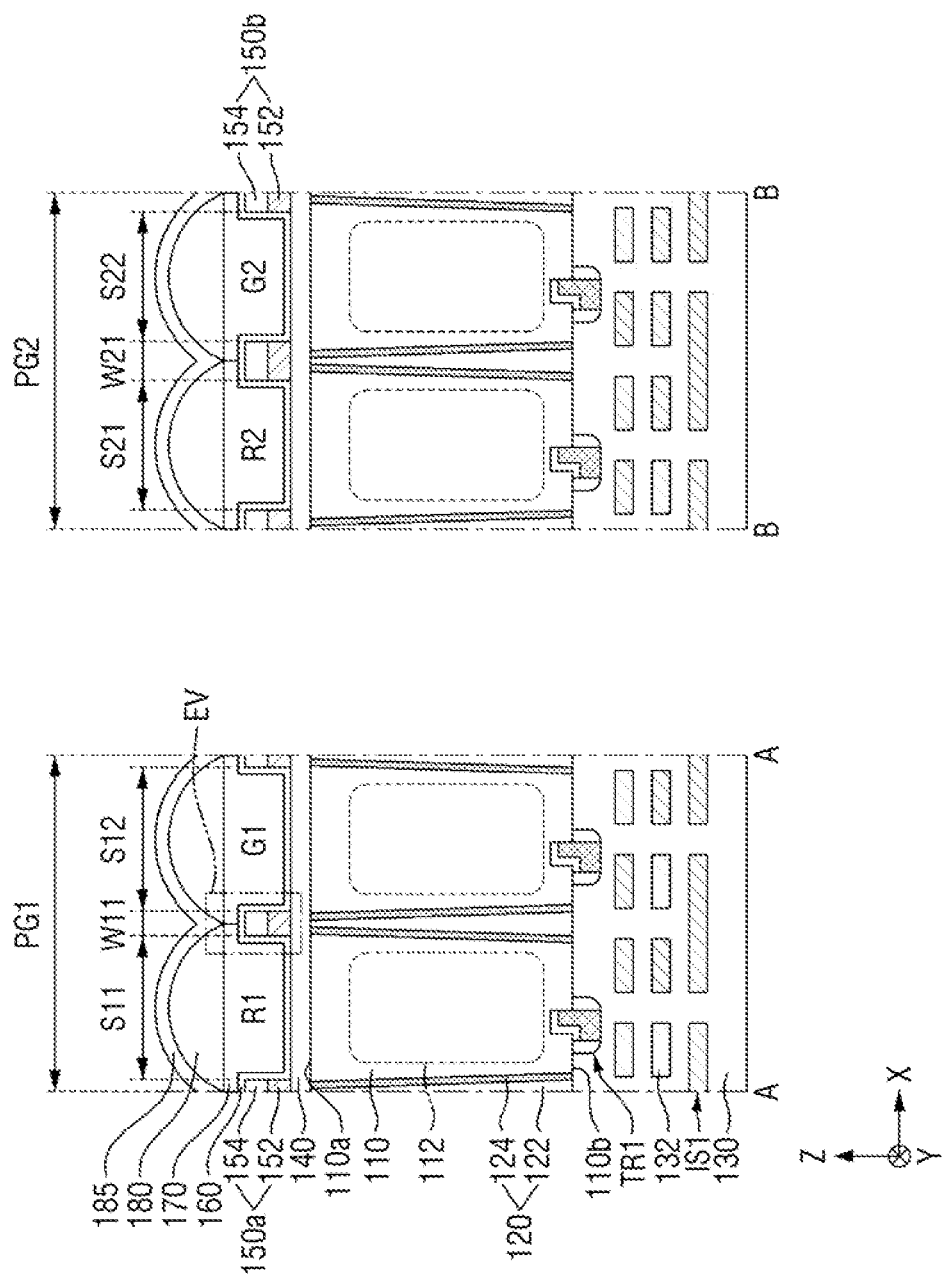
FIG. 5 is a cross-sectional view taken along A-A and B-B of FIG. 4.

FIG. 3 is a schematic layout view of a light-receiving region of the image sensor according to some embodiments. FIG. 4 is a partial layout view of a first region and a second region of FIG. 3. FIG. 5 is a cross-sectional view taken along A-A and B-B of FIG. 4. FIGS. 6a to 6d are various enlarged views of an EV region of FIG. 5.

Referring to FIG. 3, the image sensor according to some embodiments includes the light-receiving region APS.

A plurality of unit pixels UP which are configured to generate an electric signal from light may be placed inside the light-receiving region APS. The plurality of unit pixels UP may be arranged two-dimensionally (for example, in the form of a matrix) in a plane. For example, the plurality of unit pixels UP may be arranged along a first direction X and a second direction Y. The active pixel sensor array 10 of FIG. 1 may include a region corresponding to the light-receiving region APS.

The light-receiving region APS may include a first region PG1 and a second region PG2. The first region PG1 may include unit pixels UP adjacent and/or proximate to a center CP of the light-receiving region APS. The second region PG2 may include unit pixels UP spaced apart from the center CP of the light-receiving region APS; for example, unit pixels UP disposed further from the center CP than those in the first region PG1. For example, the first region PG1 may be closer to the center CP of the light-receiving region APS than the edge of the light-receiving region APS, and the second region PG2 may be closer to the edge of the light-receiving region APS than the center CP of the light-receiving region APS.

The drawings illustrate four unit pixels UP placed in the first region PG1 and the second region PG2; however this is only an example and the first and second regions PG1 and PG2 may contain a different number of pixels.

Referring to FIGS. 3 to 6a, the image sensor according to some embodiments includes a first substrate 110, a photoelectric conversion layer 112, a pixel separation pattern 120, a first electronic element TR1, a first wiring structure IS1, a surface insulating film 140, a color filter 170, grid patterns 150a and 150b, and a microlens 180.

The first substrate 110 may be a semiconductor substrate. For example, the first substrate 110 may be bulk silicon or SOI (silicon-on-insulator). The first substrate 110 may be a silicon substrate, or may include other materials, for example, silicon germanium, indium antimonide, lead tellurium compounds, indium arsenic, indium phosphide, gallium arsenide or gallium antimonide. Additionally or alternatively, the first substrate 110 may have an epitaxial layer formed on a base substrate.

The first substrate 110 may include a first face 110a and a second face 110b that are opposite to each other. In embodiments to be described below, the first face 110a may be referred to as a back side of the first substrate 110, and the second face 110b may be referred to as a front side of the first substrate 110. In some embodiments, the first face 110a of the first substrate 110 may be a photo receiving surface which faces towards incident light. Accordingly, the image sensor according to some embodiments may be a backside illumination (BSI) image sensor.

The photoelectric conversion layer 112 may be formed inside the first substrate 110. The plurality of photoelectric conversion layers 112 may correspond to a plurality of unit pixels UP. For example, the photoelectric conversion layers 112 may be arranged two-dimensionally (for example, in the form of a matrix) in a plane including the first direction X and the second direction Y, and may be placed inside each of the unit pixels UP. The photoelectric conversion layer 112 may generate the electric charge in proportion to the amount of light incident from the outside.

The photoelectric conversion layer 112 may be formed by doping impurities inside the first substrate 110. For example, the first substrate 110 may be a p-type substrate, and the photoelectric conversion layer 112 may be formed by ion-implantation of n-type impurities into substrate 110. In some embodiments, the photoelectric conversion layer 112 may have a potential slope in a vertical direction Z that intersects the surface of the first substrate 110 (e.g., the first face 110a or the second face 110b). For example, an impurity concentration of the photoelectric conversion layer 112 may decrease from the second face 110b toward the first face 110a.

The photoelectric conversion layer 112 may include, but is not necessarily limited to, for example, at least one of a photo diode, a photo transistor, a photo gate, a pinned photo diode, an organic photo diode, a quantum dot, and/or a combination thereof.

The pixel separation pattern 120 may be formed inside the first substrate 110. The pixel separation pattern 120 may define a plurality of unit pixels UP inside the first substrate 110. For example, the pixel separation pattern 120 is formed in a grid pattern from a planar viewpoint (e.g. in a plan view), and may surround each unit pixel UP arranged in the form of a matrix.

In some embodiments, the pixel separation pattern 120 may penetrate the first substrate 110. For example, the pixel separation pattern 120 may extend from the second face 110b of the first substrate 110 to the first face 110a of the first substrate 110.

In some embodiments, a width of the pixel separation pattern 120 may decrease from the second face 110b of the first substrate 110. As used herein with reference to the pixel separation pattern 120, the width refers to a width in a direction parallel to the surface of the first substrate 110 (e.g., the first face 110a or the second face 110b). This may be due to characteristics of an etching process for forming the pixel separation pattern 120. For example, a process of etching the first substrate 110 to form the pixel separation pattern 120 may be performed on the second face 110b of the first substrate 110.

In some embodiments, the pixel separation pattern 120 may include a conductive filling pattern 122 and an insulating spacer film 124. With reference to FIG. 5, for example, a separation trench which defines a plurality of unit pixels UP may be formed inside the first substrate 110. For example, the separation trench may be defined by two adjacent insulating spacer films 124. The insulating spacer film 124 may extend along the sides of the separation trench. The conductive filling pattern 122 is formed on the insulating spacer film 124 and may till the remaining region of the separation trench; for example, the conductive filing pattern 122 may fill a region between adjacent insulating spacer films 124. The insulating spacer film 124 may electrically insulate the conductive filling pattern 122 from the first substrate 110.

The conductive filling pattern 122 may include, but is not necessarily limited to, for example, polysilicon (poly Si). In some embodiments, a ground voltage or negative voltage may be applied to the conductive filling pattern 122. In such a case, an ESD (electrostatic discharge) bruise defect of the image sensor may be effectively prevented. Here, the ESD bruise defect refers to a phenomenon in which electric charges generated by ESD or the like are accumulated on the first substrate 110 to cause a bruise-like defect on the image to be generated, which may reduce image quality.

The insulating spacer film 124 may include, but is not necessarily limited to, for example, at least one of silicon oxide, aluminum oxide, tantalum oxide, and a combination thereof. In some embodiments, the insulating spacer film 124 may include a low refractive index material having a lower refractive index than the first substrate 110. In such a case, the insulating spacer film 124 may refract and/or reflect the light obliquely incident on the photoelectric conversion layer 112 to increase the light collection efficiency and increase the quality of the image sensor. Also, the insulating spacer film 124 may prevent the light charges generated in a specific unit pixel UP due to the incident light from moving to an adjacent unit pixel by a random drift.

The first electronic element TR1 may be formed on the second face 110b of the first substrate 110. The first electronic element TR1 may include various transistors for processing the electric signal generated from the unit pixels UP. For example, the first electronic element TR1 may include transistors such as the transfer transistor TG, the reset transistor RG, the source follower transistor SF or the selection transistor SEL described above in the description of FIG. 2.

In some embodiments, the first electronic component TR1 may include a vertical transfer transistor. For example, the first electronic element TR1 including the transfer transistor TG described above may partially extend into the first substrate 110. Such a transfer transistor TG may reduce an area of the unit pixel UP and thereby allow increased integration of the image sensor.

The first wiring structure IS1 may be formed on the second face 110b of the first substrate 110. The first wiring structure IS1 may include one or more wirings. For example, the first wiring structure IS1 may include a first inter-wiring insulating film 130, and a plurality of first wirings 132 in the first inter-wiring insulating film 130. In FIG. 5, the number and arrangement of wiring layers constituting the first wiring structure IS1 are illustrated for purposes of example, and the technical idea of the present disclosure is not necessarily limited thereto.

In some embodiments, the first wiring 132 may be electrically connected to the unit pixels UP. For example, the first wiring 132 may be connected to the first electronic element TR1.

The surface insulating film 140 may be formed on the first face 110a of the first substrate 110. The surface insulating film 140 may extend along the first face 110a of the first substrate 110. The surface insulating film 140 may include, but is not necessarily limited to, for example, at least one of silicon oxide, silicon nitride, silicon oxynitride, aluminum oxide, hafnium oxide, and a combination thereof.

In some embodiments, the surface insulating film 140 may include multi-films. For example, the surface insulating film 140 may include an aluminum oxide film, a hafnium oxide film, a silicon oxide film, a silicon nitride film, and a hafnium oxide which are sequentially stacked on the first face 110a of the first substrate 110.

In some embodiments, the surface insulating film 140 may function as an antireflection film to prevent the reflection of light incident on the first substrate 110. Accordingly, a light-receiving rate of the photoelectric conversion layer 112 can be increased. Further, the surface insulating film 140 may function as a flattening film to provide a color filter 170 and a microlens 180, which will be described later, at a uniform height.

The color filter 170 may be formed on the first face 110a of the first substrate 110. For example, the color filter 170 may be formed on the surface insulating film 140. The plurality of color filters 170 may correspond to the plurality of unit pixels UP. For example, the color filters 170 may be arranged two-dimensionally (for example, in the form of a matrix) in a plane including the first direction X and the second direction Y, and may be placed each unit pixel UP.

The color filter 170 may have various color filters depending on the unit pixel. For example, the color filter 170 may include a red color filter, a green color filter, and a blue color filter. However, this is only an example, the color filter 170 may include a yellow filter, a magenta filter and a cyan filter, and may further include a white filter.

In some embodiments, the color filter 170 may include first color patterns R1 and R2, second color patterns G1 and G2, and third color patterns B1 and B2 which have colors that are different from each other. As an example, the first color patterns R1 and R2 may be red color filters, the second color patterns G1 and G2 may be green color filters, and the third color patterns B1 and B2 may be blue color filters.

In some embodiments, the first color patterns R1 and R2, the second color patterns G1 and G2, and the third color patterns B1 and B2 may be arranged in a Bayer pattern. For example, as shown in FIG. 4, two second color patterns G1 and G2 may be arranged in each of the first region PG1 and the second region PG2 along a diagonal direction different than either the first direction X or the second direction Y. For example, there may be two second color patterns G1 disposed in the first region PG1, and additionally two second color patterns G2 disposed in the second region PG2, in the example embodiment of FIG. 4 where each region contains four unit pixels. The first color patterns R1 and R2 may be arranged together with one second color pattern G1 and G2 along the first direction X, and may be arranged together with the other second color pattern G1 and G2 along the second direction Y. The third color patterns B1 and B2 may be arranged together with one second color pattern G1 and G2 along the second direction Y, and may be arranged together with the other second color pattern G1 and G2 along the first direction X. The first color patterns R1 and R2 and the third color patterns B1 and B2 may be arranged along the diagonal direction different than either the first direction X or the second direction Y (for example, the first color patterns R1 and R2 and the third color patterns B1 and B2 may be arranged along a diagonal direction that is rotated 90° from the diagonal direction described above).

In some embodiments, a light-receiving area of the color filter 170 in each unit pixel UP may decrease with distance away from the center CP of the light-receiving region APS. In the present specification, the light-receiving area of the color filter 170 refers to an area in which the light incident toward the first face 110a of the first substrate 110 may pass through the color filter 170 from the planar viewpoint. For example, as shown in FIG. 4, the light-receiving areas S21, S22, and S23 of the first to third color patterns R2, G2, and B2 of the second region PG2 may be smaller than the light-receiving areas S11, S12, and S13 of the first to third color patterns R1, G1, and B1 of the first region PG1. The light-receiving area of the color filter 170 in a region between the first region PG1 and the second region PG2 may be smaller than the light-receiving area of the color filter 170 of the first region PG1, and may be greater than the light-receiving area of the color filter 170 of the second region PG2.

In some embodiments, the light-receiving areas S11, S12, and S13 of the first to third color patterns R1, G1, and B1 of the first region PG1 may be the same as each other. Further, in some embodiments, the light-receiving areas S21, S22, and S23 of the first to third color patterns R2, G2, and B2 of the second region PG2 may be the same as each other. As used herein, the use of the term "same" with reference to a dimension may refer to dimensions that are exactly the same, as well as dimensions that are substantially similar, so as to encompass minute differences that may occur due to a process margin or the like.

The grid patterns 150a and 150b may be formed on the first face 110a of the first substrate 110. For example, the grid patterns 150a and 150b may be formed on the surface insulating film 140. The grid patterns 150a and 150b may be interposed between the color filters 170. For example, the grid patterns 150a and 150b may be formed in a grid pattern from a planar viewpoint, and may surround each color filter 170 arranged in the form of a matrix. In some embodiments, the grid patterns 150a and 150b may overlap the pixel separation pattern 120 in the vertical direction Z.

In some embodiments, the grid patterns 150a and 150b may include a first substance pattern 152 and a second substance pattern 154. The first substance pattern 152 and the second substance pattern 154 may be sequentially stacked on the surface insulating film 140. The first substance pattern 152 may include substances that are different from those included in the second substance pattern 154. As an example, the first substance pattern 152 may be a metal pattern, and the second substance pattern 154 may be an oxide pattern. As another example, the first substance pattern 152 may be a first metal pattern, and the second substance pattern 154 may be a second metal pattern different from the first metal pattern.

The metal pattern may include, but is not necessarily limited to, for example, at least one of titanium (Ti), titanium nitride (TiN), tantalum (Ta), tantalum nitride (TaN), tungsten (W), aluminum (Al), copper (Cu), and combinations thereof. In some embodiments, the first substance pattern 152 including the metal pattern may prevent electric charges generated by ESD or the like from being accumulated on the surface of the first substrate 110 (e.g., the first face 110*a*) to effectively prevent an ESD bruise defect.

The oxide pattern may include, but is not necessarily limited to, for example, at least one of metal oxides such as titanium oxides, tantalum oxides, tungsten oxides, aluminum oxides and copper oxides, silicon oxides and combinations thereof. In some embodiments, the second substance pattern 154 may include a low refractive index material, which may have a lower refractive index than silicon (Si). In such a case, the second substance pattern 154 may refract or reflect the light obliquely incident on the photoelectric conversion layer 112 to increase the light collection efficiency and increase the quality of the image sensor.

In some embodiments, the width of the grid patterns 150*a* and 150*b* may increase with distance from the center CP of the light-receiving region APS. Here, the width refers to a width in a direction parallel to the surface of the first substrate 110 (or example, the first face 110*a* or the second face 110*b*). For example, as shown in FIGS. 3 to 5, the widths W21 and W22 of the grid pattern 150*b* of the second region PG2 may be greater than the widths W11 and W12 of the grid pattern 150*a* of the first region PG1. As an example, the widths W11 and W12 of the grid pattern 150*a* of the first region PG1 may be about 170 nm to about 190 nm, and the widths W21 and W22 of the grid pattern 150*b* of the second region PG2 may be about 190 nm to about 210 nm. The widths of the grid patterns 150*a* and 150*b* interposed between the first region PG1 and the second region PG2 may be greater than the widths W11 and W12 of the grid pattern 150*a* of the first region PG1, and may be smaller than the widths W21 and W22 of the grid pattern 150*b* of the second region PG2.

Accordingly, as described above, the light-receiving area of the color filters 170 may be reduced with distance from the center CP of the light-receiving region APS. For example, as shown in FIG. 5, the light-receiving area of the color filter 170 may refer to the area of the color filter 170 defined by the grid patterns 150*a* and 150*b* from the planar viewpoint.

In some embodiments, the width W11 of the grid pattern 150*a* between the first color pattern R1 of the first region PG1 and the second color pattern G1 of the first region PG1 may be the same as the width W12 of the grid pattern 150*a* between the second color pattern G1 of the first region PG1 and the third color pattern B1 of the first region PG1 (refer to FIG. 4 for an illustrative example). Also, in some embodiments, the width W21 of the grid pattern 150*b* between the first color pattern R2 of the second region PG2 and the second color pattern G2 of the second region PG2 may be the same as the width W22 of the grid pattern 150*b* between the second color pattern G2 of the second region PG2 and the third color pattern B2 of the second region PG2.

Figure 6A:
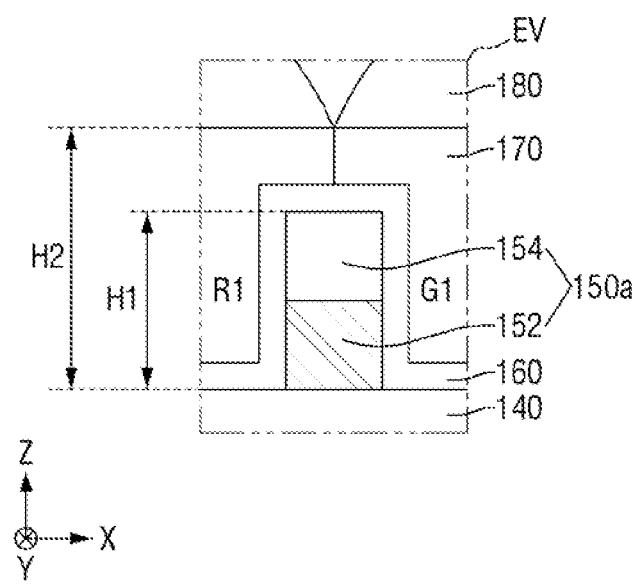
FIGS. 6a through 6d are various enlarged views of an EV region of FIG. 5.

In some embodiments, the height of the grid patterns 150*a* and 150*b* may be lower than the height of the color filter 170. For example, as shown in FIGS. 5 and 6*a*, a height H1 of the upper surface of the grid patterns 150*a* and 150*b* may be lower than a height H2 of the upper surface of the color filter 170 from the upper surface of the surface insulating film 140. As an example, as measured from the upper surface of the surface insulating film 140, the height H1 of the upper surface of the grid patterns 150*a* and 150*b* may be about 3,000 Å to about 5,000 Å, and the height H2 of the upper surface of the color filter 170 may be from about 5,000 Å to about 10,000 Å. In such cases, the grid patterns 150*a* and 150*b* may not completely form separations in the color filter 170. As an example, the first color patterns R1 and R2 and the second color patterns G1 and G2 may be in contact with each other on the upper surface of the grid patterns 150*a* and 150*b*. Further, the third color patterns B1 and B2 and the second color patterns G1 and G2 may be in contact with each other on the upper surface of the grid patterns 150*a* and 150*b*.

In some embodiments, a first protective film 160 may be further formed on the surface insulating film 140 and the grid patterns 150*a* and 150*b*. The first protective film 160 may conformally extend along the profiles of the upper surface of the surface insulating film 140, and the side surfaces and upper surface of the grid patterns 150*a* and 150*b*. The first protective film 160 may be interposed between the surface insulating film 140 and the color filter 170, and between the grid patterns 150*a* and 150*b* and the color filter 170.

The first protective film 160 may prevent damage to the surface insulating film 140 and the grid patterns 150*a* and 150*b*. The first protective film 160 may include, but is not necessarily limited to, for example, aluminum oxide.

A microlens 180 may be formed on the first face 110*a* of the first substrate 110. For example, the microlens 180 may be formed on the color filter 170. The plurality of microlenses 180 may correspond to a plurality of unit pixels UP. For example, the plurality of microlenses 180 may be arranged two-dimensionally (for example, in the form of a matrix) in a plane including the first direction X and the second direction Y, and may be placed in each unit pixel UP.

The microlens 180 has a convex shape, and may have a predetermined radius of curvature. As a result, the microlens 180 may concentrate light which is incident on the photoelectric conversion layer 112. The microlens 180 may include, but is not necessarily limited to, for example, a light-transmitting resin.

In some embodiments, a second protective film 185 may be further formed on the microlens 180. The second protective film 185 may extend along the surface of the microlens 180. The second protective film 185 may include an inorganic oxide. For example, the second protective film 185 may include, but is not necessarily limited to, at least one of silicon oxide, titanium oxide, zirconium oxide, hafnium oxide, and a combination thereof. In an example, the second protective film 185 may include a low-temperature oxide (LTO).

The second protective film 185 may protect the microlens 180 from the outside. For example, the second protective film 185 including an inorganic oxide may cover and protect the microlens 180, which includes an organic material such as light-transmitting resin. Also, the second protective film 185 may increase the light collection efficiency of the microlens 180 to increase the quality of the image sensor. For example, the second protective film 185 may reduce reflection, refraction, scattering, or the like of incident light that reaches the space between the microlenses 180, by filing the space between the microlenses 180.

In an electronic device including an image sensor, light incident from the outside may pass through a module lens and reach the light-receiving region APS of the image sensor. At this time, the amount of light passing through the central portion of the module lens may be greater than the amount of light passing through the outer peripheral portion of the module lens. Further, the amount of light passing through the central portion of the module lens and the amount of light passing through the outer peripheral portion of the module lens may vary depending on the wavelength (e.g., color) of the light. As a result, the electronic device including the image sensor may exhibit a shading phenomenon in which a darker image is output toward the edge, or a specific color is predominantly expressed at the edge. As an example, an amount of light (R/G ratio) of the red wavelength compared to the green wavelength passing through the outer peripheral portion of the module lens may differ from an amount of light (R/G ratio) of the red wavelength compared to the green wavelength passing through the central portion of the module lens. Additionally or alternatively, an amount of light (B/G ratio) of the blue wavelength compared to the green wavelength passing through the outer peripheral portion of the module lens may differ from an amount of light (B/G ratio) of the blue wavelength compared to the green wavelength passing through the central portion of the module lens.

However, the image sensor according to some embodiments of this disclosure may reduce the shading phenomenon, by utilizing a color filter 170 in which the light-receiving area is reduced with distance from the center of the light-receiving region APS. For example, as described above, the light-receiving areas S21, S22, and S23 of the first to third color patterns R2, G2, and B2 of the second region PG2 adjacent to the edge of the light-receiving region APS may be smaller than the light-receiving areas S11, S12, and S13 of the first to third color patterns R1, G1, and B1 of the first region PG1 adjacent to the center CP of the light-receiving region APS. As a result, a difference between the amount of light (R/G ratio) of the red wavelength compared to the green wavelength passing through the second region PG2 and the amount of light (R/G ratio) of the red wavelength compared to the green wavelength passing through the first region PG1 may be reduced. Additionally or alternatively, a difference between the amount of light (B/G ratio) of the blue wavelength compared to the green wavelength passing through the second region PG2 and the amount of light (B/G ratio) of the blue wavelength compared to the green wavelength passing through the first region PG1 may be reduced. Thus, the image sensor according to embodiments of the present disclosure may correct for differences in red-green and blue-green ratios of light that may occur between light incident on the center of the image sensor and light incident on the edges or peripheral regions of the image sensor. Accordingly, it is possible to provide an image sensor in which the shading phenomenon is decreased and the quality is increased.

Figure 6B:
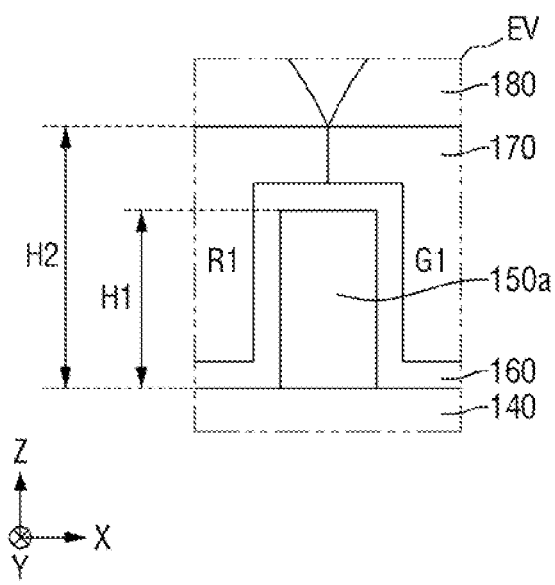

Referring to FIGS. 5 and 6*b*, in the image sensor according to some embodiments, the grid patterns 150*a* and 150*b* may include a single substance pattern. For example, the grid patterns 150*a* and 150*b* may include a single metal pattern or a single oxide pattern. The single metal pattern may include, but is not necessarily limited to, for example, at least one of at least one of titanium (Ti), titanium nitride (TiN), tantalum (Ta), tantalum nitride (TaN), tungsten (W), aluminum (Al), copper (Cu), and combinations thereof. The single oxide pattern may include, but is not necessarily limited to, for example, at least one of metal oxides such as titanium oxide, tantalum oxide, tungsten oxide, aluminum oxide and copper oxide, silicon oxide, and combinations thereof.

Figure 6C:
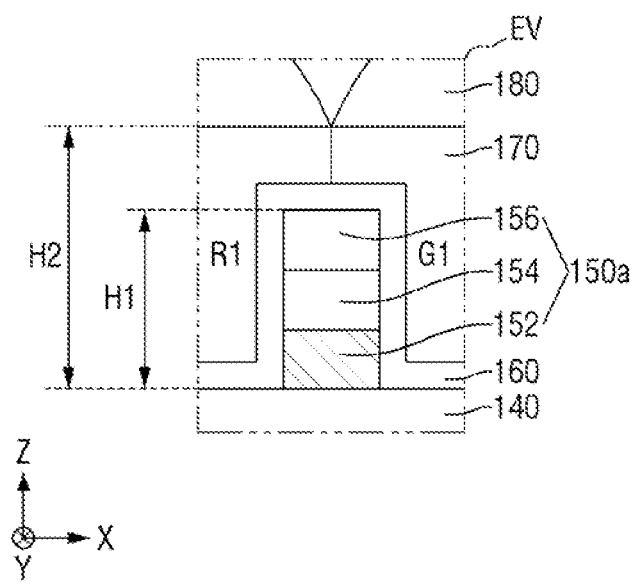

Referring to FIGS. 5 and 6*c*, in the image sensor according to some embodiments, the grid patterns 150*a* and 150*b* may include two or more substances. In embodiment illustrated in FIG. 6*c*, for example, the grid patterns 150*a* and 150*b* may include a first substance pattern 152, a second substance pattern 154, and a third substance pattern 156.

The first substance pattern 152, the second substance pattern 154, and the third substance pattern 156 may be sequentially stacked on the surface insulating film 140. The first substance pattern 152, the second substance pattern 154 and the third substance pattern 156 may include different substances from each other. As an example, the first substance pattern 152 may be a metal pattern, and the second substance pattern 154 and the third substance pattern 156 may be oxide patterns. As another example, the first substance pattern 152 and the second substance pattern 154 may be metal patterns, and the third substance pattern 156 may be an oxide pattern. As still another example, the first substance pattern 152 may be a first metal pattern, the second substance pattern 154 may be a second metal pattern different from the first metal pattern, and the third substance pattern 156 may be an oxide pattern.

The metal pattern may include, but are not necessarily limited to, for example, at least one of titanium (Ti), titanium nitride (TiN), tantalum (Ta), tantalum nitride (TaN), tungsten (W), aluminum (Al), copper (Cu), and combinations thereof. The oxide pattern may include, but is not necessarily limited to, for example, at least one of metal oxides such as titanium oxides, tantalum oxides, tungsten oxides, aluminum oxides and copper oxides, silicon oxides and combinations thereof.

Figure 6D:
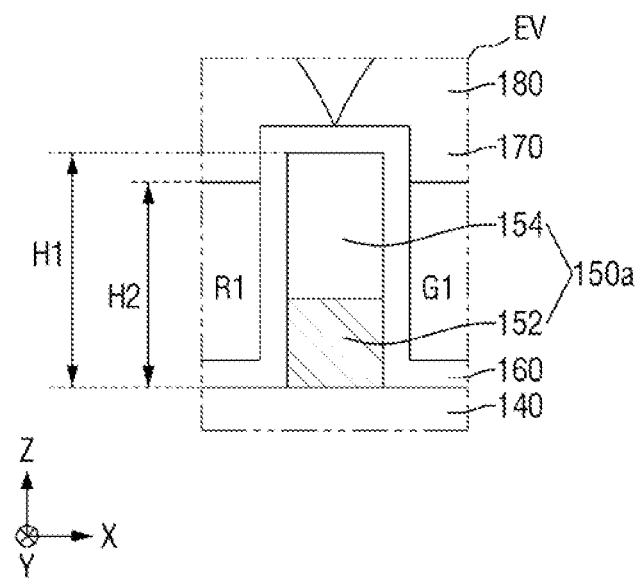

Referring to FIGS. 5 and 6*d*, in the image sensor according to some embodiments, the height of the grid patterns 150*a* and 150*b* may be the same as or greater than the height of the color filter 170.

For example, the height H1 of the upper surface of the grid patterns 150*a* and 150*b* may be greater than the height H2 of the upper surface of the color filter 170 as measured from the upper surface of the surface insulating film 140. In such a case, the grid patterns 150*a*, 150*b* may form complete separations in the color filters 170. As an example, the first color patterns R1 and R2 and the second color patterns G1 and G2 may be spaced apart from each other by the grid patterns 150*a* and 150*b*. The third color patterns B1 and B2 and the second color patterns G1 and G2 may be spaced apart from each other by the grid patterns 150*a* and 150*b*. This case contrasts with the previously described examples, in which the different color patterns may be integrally formed in the color filter 170.

Figure 7:
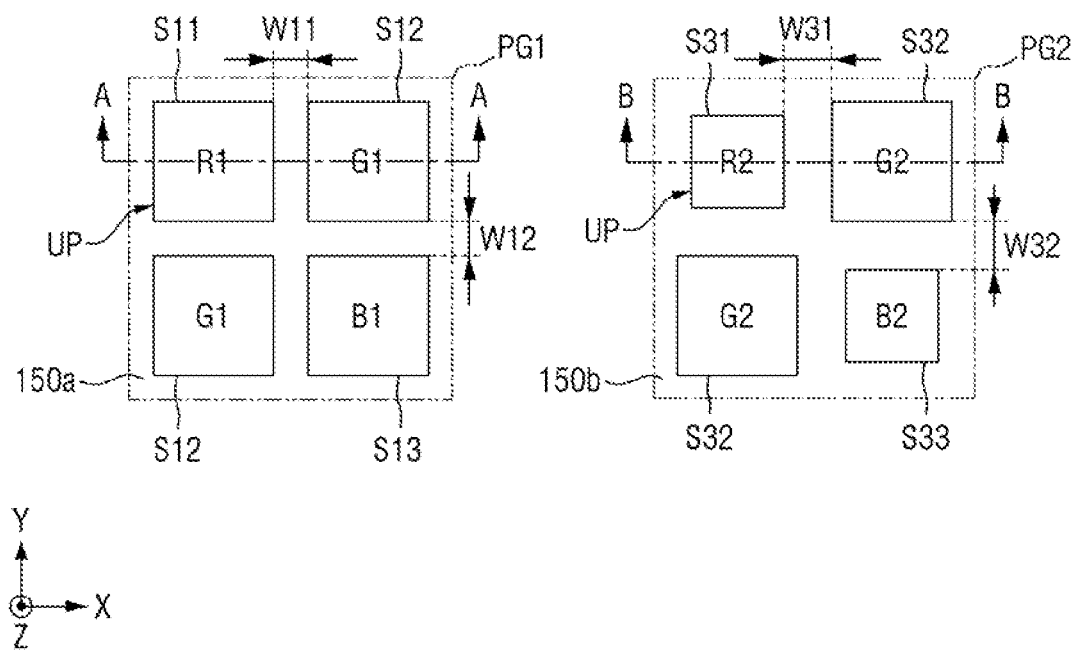
FIG. 7 is a partial layout view of the first region and the second region of the image sensor according to some embodiments.
Figure 8:
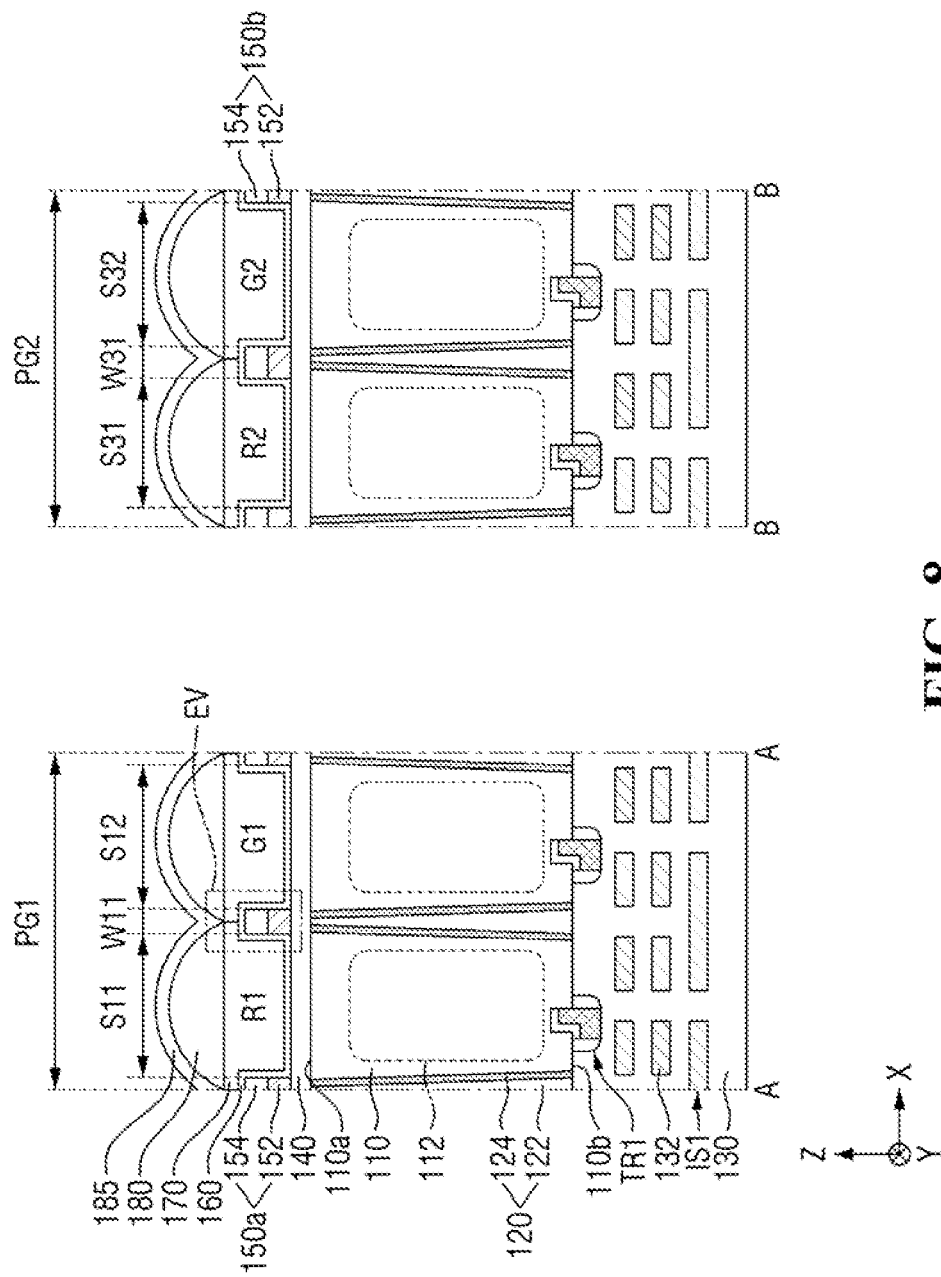
FIG. 8 is a cross-sectional view taken along A-A and B-B of FIG. 7.

FIG. 7 is a partial layout view of the first region and the second region of the image sensor according to some embodiments. FIG. 8 is a cross-sectional view taken along A-A and B-B of FIG. 7. For convenience of explanation, repeated components already explained above with reference to FIGS. 1 to 6*d* will be briefly explained or omitted.

Referring to FIGS. 7 and 8, in the image sensor according to some embodiments, light-receiving areas S31 and S33 of the first and third color patterns R2 and B2 of the second region PG2 are each smaller than a light-receiving area S32 of the second color pattern G2 of the second region PG2.

As a result, the difference may be further reduced between the amount of light (R/G ratio) of the red wavelength compared to the green wavelength passing through the second region PG2 and the amount of light (R/G ratio) of the red wavelength compared to the green wavelength passing through the first region PG1. Additionally or alternatively, the difference may be further reduced between the amount of light (B/G ratio) of the blue wavelength compared to the green wavelength passing through the second region PG2 and the amount of light (B/G ratio) of the blue wavelength compared to the green wavelength passing through the first region PG. Accordingly, an image sensor according to this embodiment may be provided in which the shading phenomenon is further decreased and the quality is increased.

In some embodiments, the light-receiving areas S31 and S33 of the first and third color patterns R2 and B2 of the second region PG2 may be identical to each other.

In some embodiments, the light-receiving area S32 of the second color pattern G2 of the second region PG2 may be the same the light-receiving area S12 of the second color pattern G1 of the first region PG1. For example, in some embodiments, the light-receiving areas corresponding to the red and blue color patterns may decrease with distance from the center of the image sensor, while the light-receiving areas corresponding to the green color patterns may remain the same across the image sensor.

In some embodiments, a width W31 of the grid pattern 150b between the first color pattern R2 of the second region PG2 and the second color pattern G2 of the second region PG2 may be the same as a width W32 of the grid pattern 150b between the second color pattern G2 of the second region PG2 and the third color pattern B2 of the second region PG2.

Figure 9:
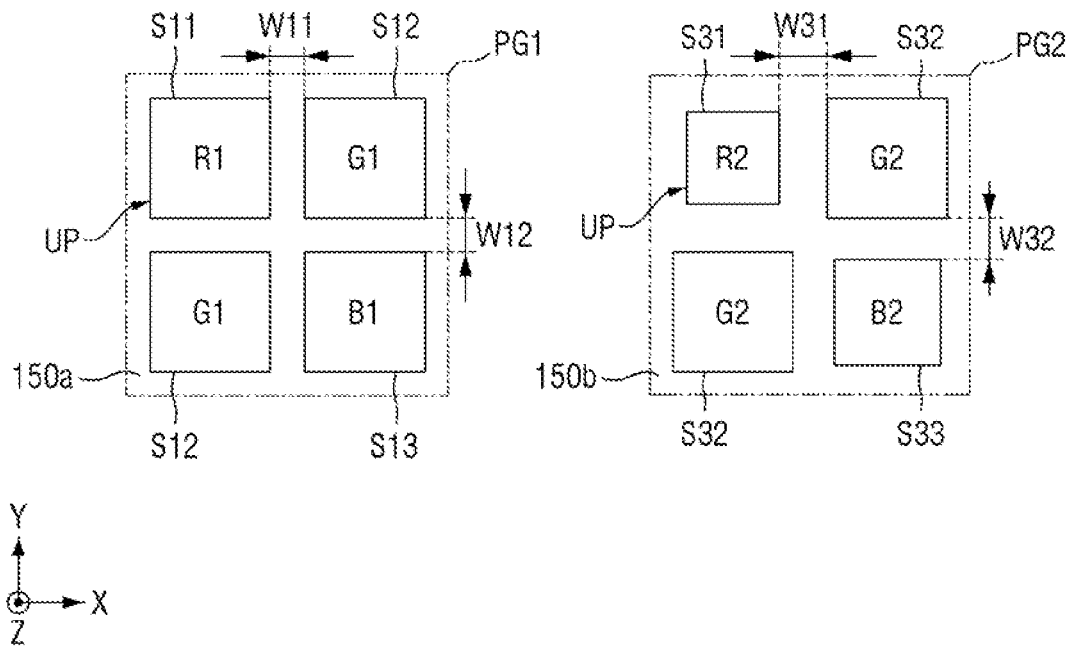
FIGS. 9 to 11 are various partial layout views of the first region and the second region of the image sensor according to some embodiments.
Figure 10:
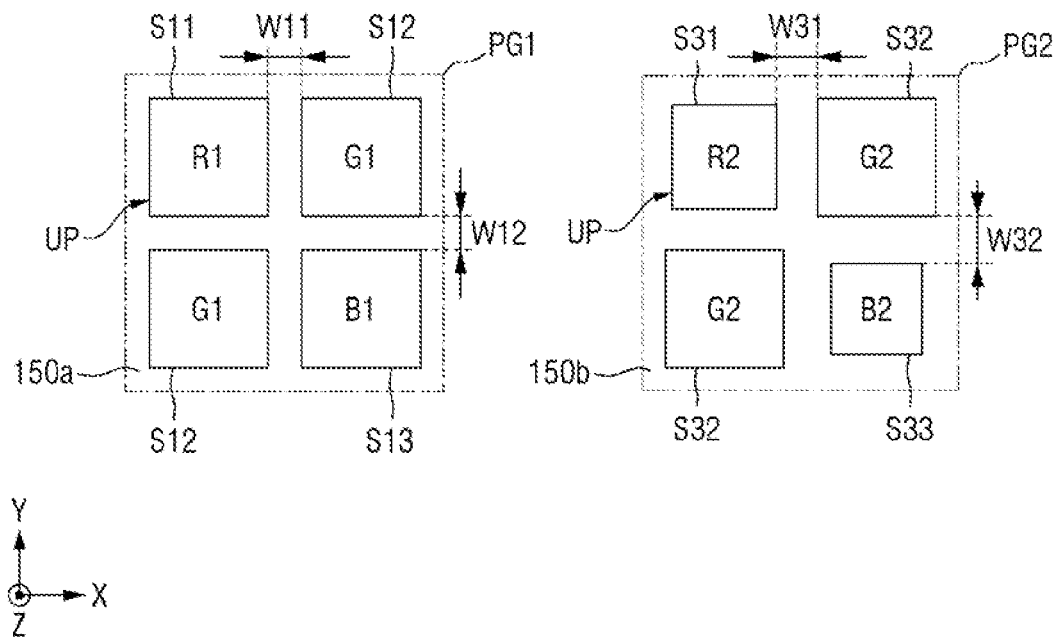
Figure 11:
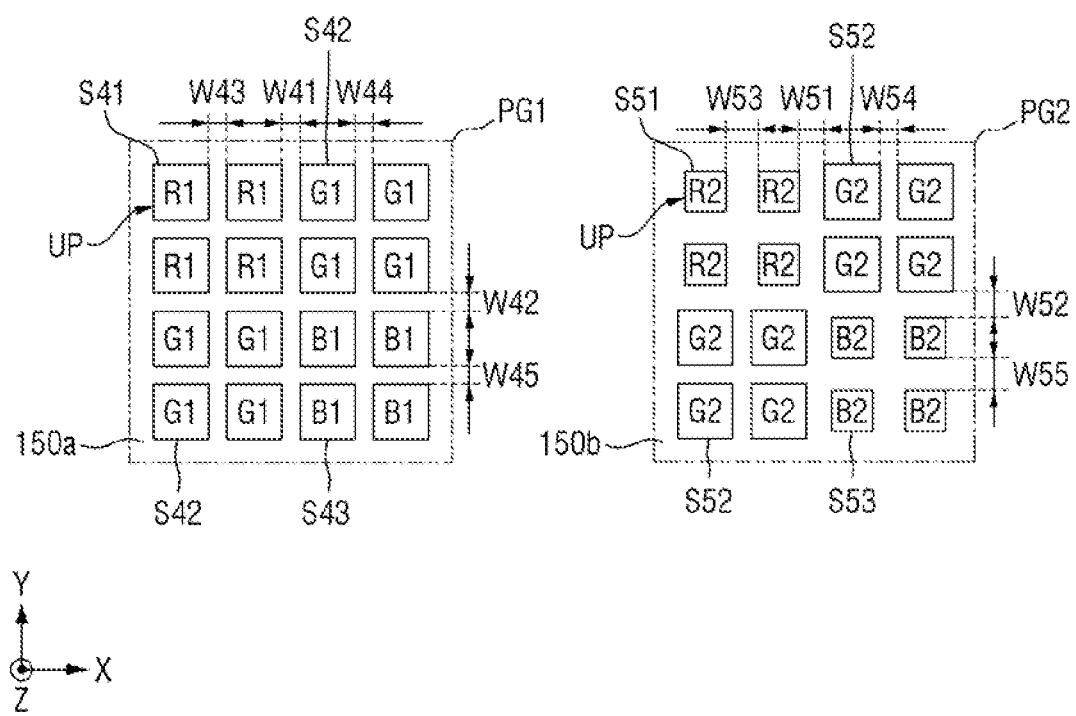

FIGS. 9 to 11 are various partial layout views of the first region and the second region of the image sensor according to some embodiments. For convenience of explanation, repeated components already explained above with reference to FIGS. 1 to 8 will be briefly explained or omitted.

Referring to FIG. 9, in the image sensor according to some embodiments, a light-receiving area S31 of the first color pattern R2 of the second region PG2 is smaller than a light-receiving area S33 of the third color pattern B2 of the second region PG2.

In some embodiments, the width W31 of the grid pattern 150b between the first color pattern R2 and the second color pattern G2 of the second region PG2 may be greater than the width W32 of the grid pattern 150b between the second color pattern G2 and the third color pattern B2 of the second region PG2.

Referring to FIG. 9, in the image sensor according to some embodiments, the light-receiving area S33 of the third color pattern B2 of the second region PG2 is greater than the light-receiving area S31 of the first color pattern R2 of the second region PG2, while still being smaller than the light-receiving area S32 of the second color pattern G2 of the second region PG2.

Referring to FIG. 10, in the image sensor according to some embodiments, the light-receiving area S31 of the first color pattern R2 of the second region PG2 is greater than the light-receiving area S33 of the third color pattern B2 of the second region PG2, and is smaller than the light-receiving area S32 of the second color pattern G2 of the second region PG2.

In some embodiments, the width W31 of the grid pattern 150b between the first color pattern R2 and the second color pattern G2 of the second region PG2 may be less than the width W32 of the grid pattern 150b between the second color pattern G2 and the third color pattern B2 of the second region PG2.

Referring to FIG. 11, in the image sensor according to some embodiments, the first color patterns R1 and R2, the second color patterns G1 and G2, and the third color patterns B1 and B2 may be arranged in the form of a tetra pattern.

The tetra pattern may include an array in which four unit pixels UP adjacent to each other in a rectangular shape have the same color. For example, as shown, the first color patterns R1 and R2, the second color patterns G1 and G2, and the third color patterns B1 and B2 may correspond to the four adjacent unit pixels UP arranged in a rectangular shape.

In some embodiments, light-receiving areas S51 and S53 of each of the first and third color patterns R2 and B2 of the second region PG2 may be smaller than a light-receiving area S52 of each second color pattern G2 of the second region PG2. Although the light-receiving areas S31 and S33 of each of the first and third color patterns R2 and B2 of the second region PG2 are shown as being the same as each other, this is only an example, and the light-receiving areas S31 and S33 may differ from each other in some embodiments.

In some embodiments, the light-receiving area S52 of each of the second color patterns G2 of the second region PG2 may be the same as the light-receiving area S42 of each of the light-receiving areas S52 of the second color pattern G1 of the first region PG1.

In some embodiments, a width W51 of the grid pattern 150b between the first color pattern R2 of the second region PG2 and the second color pattern G2 of the second region PG2 may be the same as a width W52 of the grid pattern 150b between the second color pattern G2 of the second region PG2 and the third color pattern B2 of the second region PG2. However, this is only an example, and the widths W51 and W52 may differ from each other.

In some embodiments, a width W53 of the grid pattern 150b between the first color patterns R2 of the second region PG2 may be the same as a width W55 of the grid pattern 150b between the third color patterns B2 of the second region PG2. However, this is only an example, and the widths W53 and W55 may differ from each other.

In some embodiments, a width W54 of the grid pattern 150b between the second color patterns G2 of the second region PG2 may be smaller than the width W53 of the grid pattern 150b between the first color patterns R2 of the second region PG2 and the width W55 of the grid pattern 150b between the third color patterns B2 of the second region PG2.

Although the color patterns are illustrated as being arranged in the form of a 2×2 tetra pattern, the color patterns may be arranged in various forms such as a 3×3 nona pattern form and a 4×4 pattern form.

Figure 12:
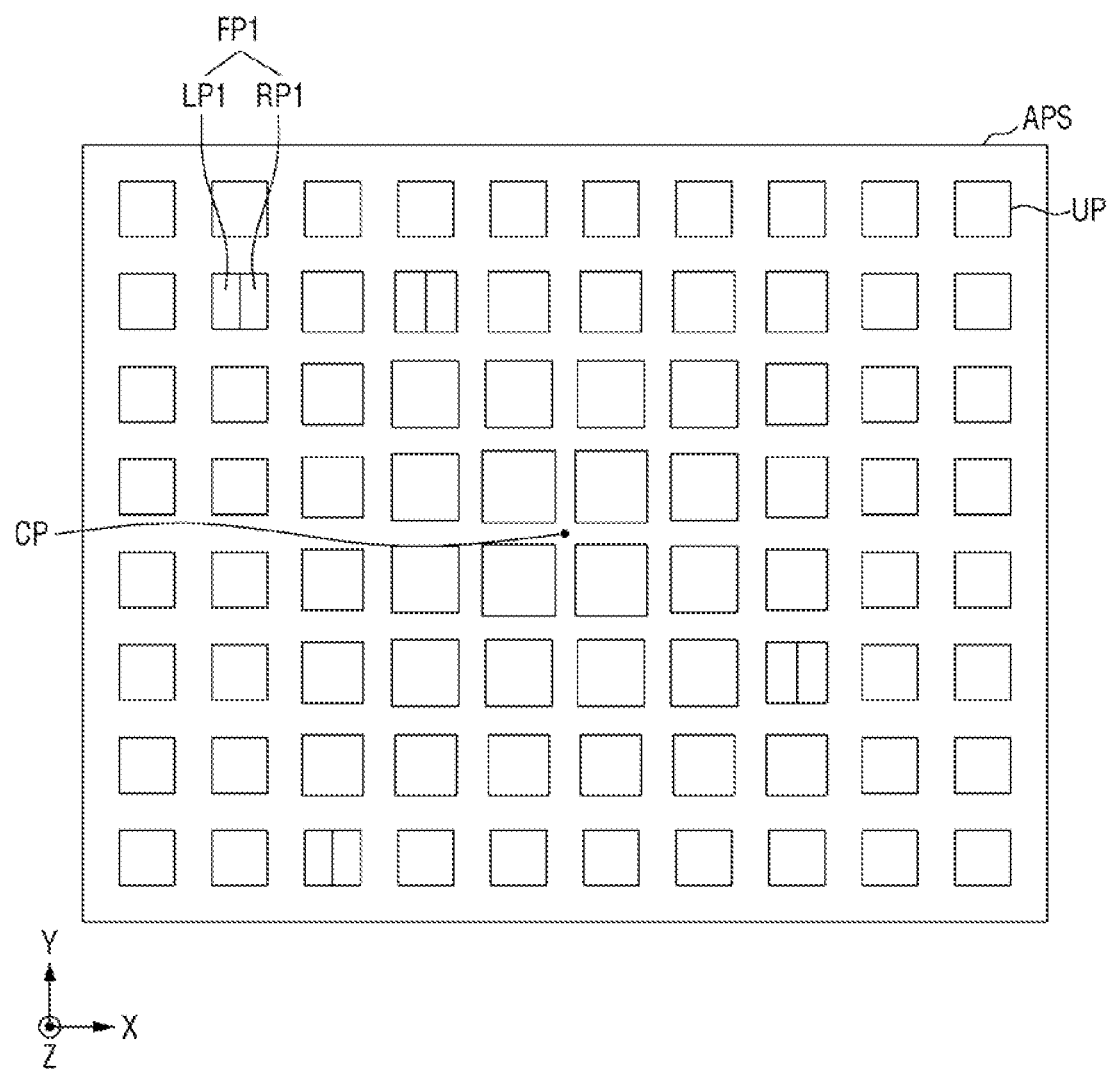
FIGS. 12 and 13 are schematic layout views of the light-receiving region of the image sensor according to some embodiments.
Figure 13:
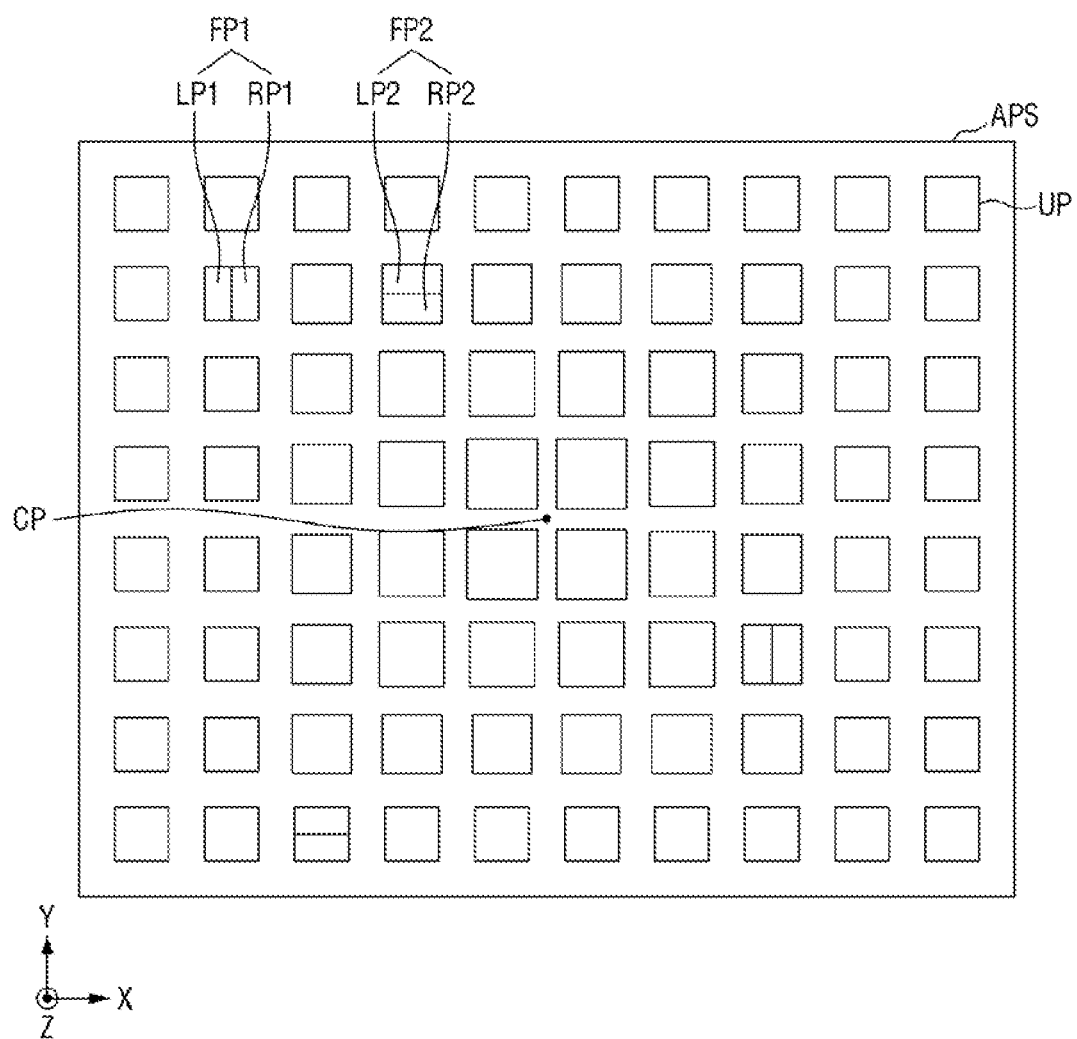

FIGS. 12 and 13 are schematic layout views of the light-receiving region of the image sensor according to some embodiments. For convenience of explanation, repeated components already explained above with reference to FIGS. 1 to 11 will be briefly explained or omitted.

Referring to FIG. 12, in the image sensor according to some embodiments, the unit pixels UP may include at least one first focus pixel FP1.

The first focus pixel FP1 may include a first subpixel LP1 and a second subpixel RP1. The first subpixel LP1 and the second subpixel RP1 may be arranged along the first direction X, as an example.

Referring to FIG. 13, in the image sensor according to some embodiments, the unit pixels UP may include at least one second focus pixel FP2.

The second focus pixel FP2 may include a third subpixel LP2 and a fourth subpixel RP2. The third subpixel LP2 and the fourth subpixel RP2 may be arranged along a second direction Y which intersects the first direction X.

The first focus pixel FP1 and the second focus pixel FP2 may both be configured to provide an auto focus (AF) function. For example, since the first focus pixel FP1 and the second focus pixel FP2 may each include two subpixels (the first subpixel LP1 and the second subpixel RP1, or the third subpixel LP2 and the fourth subpixel RP2), the auto focus function may be performed using a phase detection AF (PDAF).

Figure 14:
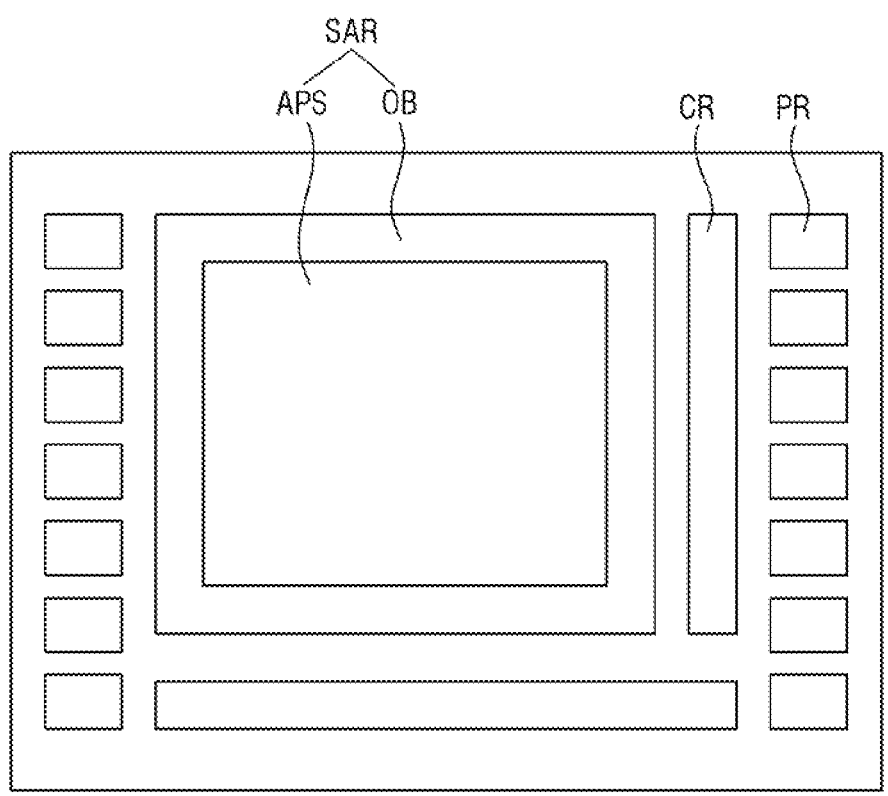
FIG. 14 is a schematic layout view of the image sensor according to some embodiments.
Figure 15:
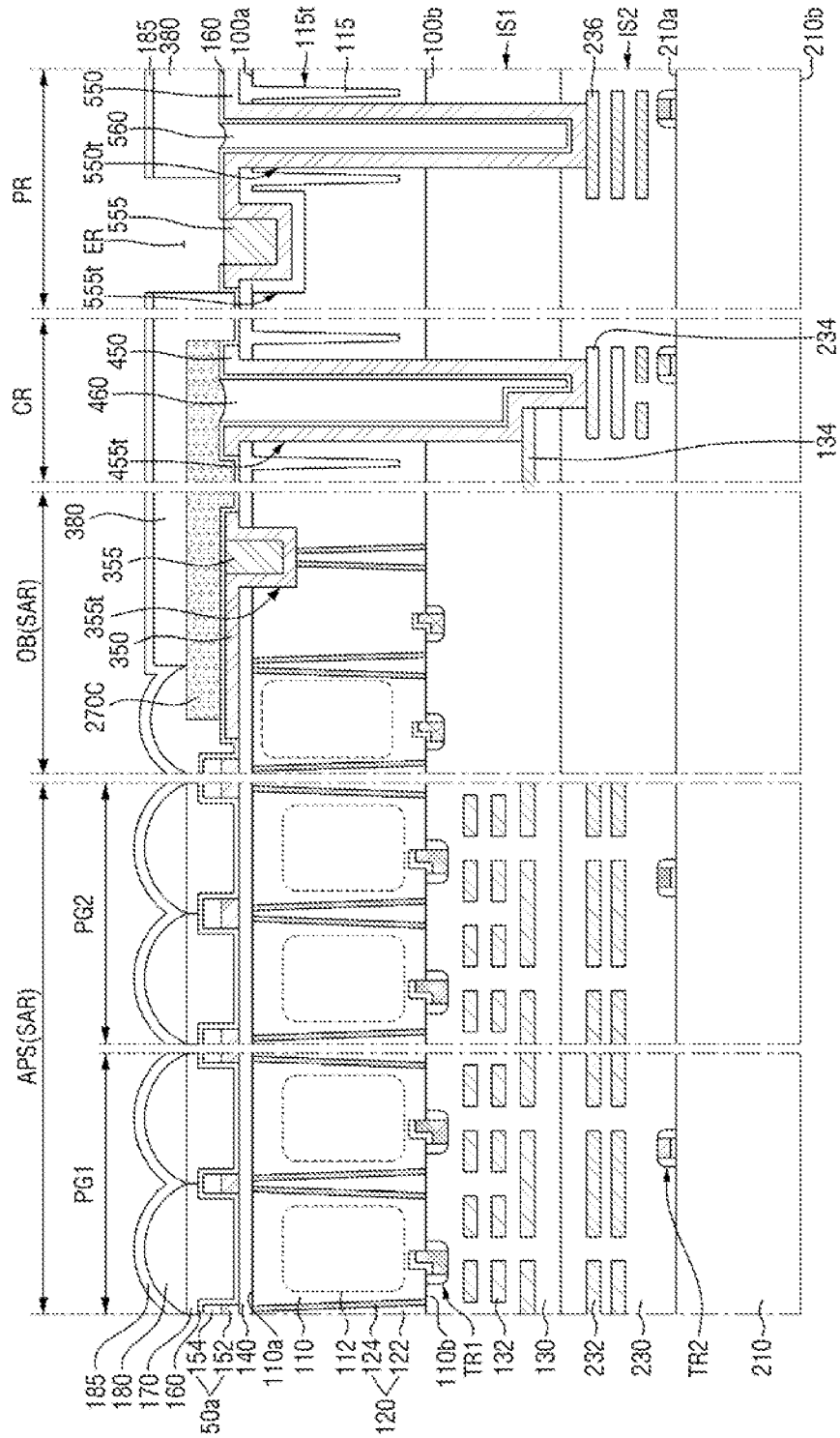
FIG. 15 is a schematic cross-sectional view of the image sensor according to some embodiments.

FIG. 14 is a schematic layout view of the image sensor according to some embodiments. FIG. 15 is a schematic cross-sectional view of the image sensor according to some embodiments. For convenience of explanation, repeated components already explained above with reference to FIGS. 1 to 13 will be briefly explained or omitted.

Referring to FIGS. 14 and 15, the image sensor according to some embodiments may include a sensor array region SAR, a connection region CR, and a pad region PR.

The sensor array region SAR may include a region corresponding to the active pixel sensor array 10 of FIG. 1. For example, a plurality of unit pixels (for example, UP of FIG. 3) arranged two-dimensionally (for example, in the form of a matrix) may be placed in the sensor array region SAR.

The sensor array region SAR may include a light-receiving region APS and a light-shielding region OB. Active pixels that receive light and are configured to generate an active signal therefrom may be arranged in the light-receiving region APS. Optical black pixels that block light to generate an optical black signal may be arranged in the light-shielding region OB. The light-shielding region OB may be formed along the periphery of the light receiving region APS as illustrated in FIGS. 14-15; however, this is only an example.

In some embodiments, the photoelectric conversion layer 112 may be disposed in only one portion of the light-shielding region OB. For example, the photoelectric conversion layer 112 may be formed in the first substrate 110 of the light-shielding region OB adjacent to the light-receiving region APS, but might not be formed in the first substrate 110 of the light-shielding region OB that is spaced apart from the light-receiving region APS. In some embodiments, dummy pixels may be formed in the light-receiving region APS adjacent to the light-shielding region OB.

The connection region CR may be formed around the sensor array region SAR. Although the connection region CR may be formed on one side of the sensor array region SAR, this is only an example. Wirings are formed in the connection region CR and may be configured to transmit and receive electrical signals of the sensor array region SAR.

The pad region PR may be formed around the sensor array region SAR. The pad region PR may be formed on one or more lateral sides of the sensor array region SAR. Although the pad region PR may be formed adjacent to the edge of the image sensor according to some embodiments, this is only an example. The pad region PR may be configured to be connected to an external device or the like to transmit and receive electrical signals between the image sensor and the external device.

Although the connection region CR is shown as being interposed between the sensor array region SAR and the pad region PR, this is only an example. The placement of the sensor array region SAR, the connection region CR and the pad region PR may vary in different embodiments.

In some embodiments, the first wiring structure IS1 may include a first wiring 132 in the sensor array region SAR, and a second wiring 134 in the connection region CR. The first wiring 132 may be electrically connected to unit pixels (e.g., UP of FIG. 3) of the sensor array region SAR. For example, the first wiring 132 may be connected to the first electronic element TR1. At least a part of the second wiring 134 may be electrically connected to at least a part of the first wiring 132. For example, at least a part of the second wiring 134 may extend from the sensor array region SAR. Accordingly, the second wiring 134 may be electrically connected to the unit pixels (e.g., UP of FIG. 3) of the sensor array region SAR.

The image sensors according to some embodiments may further include a second substrate 210, a second wiring structure IS2, a first connection structure 350, a second connection structure 450, a third connection structure 550, an element separation pattern 115, a light-shielding filter 270C, and a third protective film 380.

The second substrate 210 may be bulk silicon or SOI (silicon-on-insulator). The second substrate 210 may be a silicon substrate, or may include other materials, for example, silicon germanium, indium antimonide, lead tellurium compounds, indium arsenic, indium phosphide, gallium arsenide or gallium antimonide. Alternatively, the second substrate 210 may have an epitaxial layer formed on a base substrate.

The second substrate 210 may include a third face 210a and a fourth face 210b that are opposite to each other. In some embodiments, the third face 210a of the second substrate 210 may face the second face 110b of the first substrate 110.

In some embodiments, a second electronic element TR2 may be formed on the third face 210a of the second substrate 210. The second electronic element TR2 may be electrically connected to the sensor array region SAR to transmit and receive an electrical signal to and from each unit pixel (e.g., UP of FIG. 3) of the sensor array region SAR. For example, the second electronic element TR2 may include electronic components that constitute the row decoder 20, the row driver 30, the column decoder 40, the timing generator 50, the correlated double sampler 60, the analog-to-digital converter 70 or the I/O buffer 80 of FIG. 1.

The second wiring structure IS2 may be formed on the third face 210a of the second substrate 210. The second wiring structure IS2 may be connected to the first wiring structure IS1. For example, as shown in FIG. 15, the upper surface of the second wiring structure IS2 may contact to the lower surface of the first wiring structure IS1.

The second wiring structure IS2 may include one or more wirings. For example, the second wiring structure IS2 may include a second inter-wiring insulating film 230, and a plurality of wirings 232, 234, and 236 in the second inter-wiring insulating film 230. In FIG. 15, the number of layers and the arrangement of the wirings constituting the second wiring structure IS2 are illustrated as examples, and are not necessarily limited thereto.

At least some of the wirings 232, 234, and 236 of the second wiring structure IS2 may be connected to the second electronic element TR2. In some embodiments, the second wiring structure IS2 may include a third wiring 232 in the sensor array region SAR, a fourth wiring 234 in the connection region CR, and a fifth wiring 236 in the pad region PR. In some embodiments, the fourth wiring 234 may be the uppermost wiring among the plurality of wirings in the connection region CR, and the fifth wiring 236 may be the uppermost wiring among the plurality of wirings 232, 234 and 236 in the pad region PR.

The first connection structure 350 may be formed inside the light-shielding region OB. The first connection structure 350 may be formed on the surface insulating film 140 of the light-shielding region OB. In some embodiments, the first connection structure 350 may be in contact with the pixel separation pattern 120. For example, a first trench 355t that exposes the pixel separation pattern 120 may be formed in the first substrate 110 and penetrate the surface insulating film 140 of the light-shielding region OB. Accordingly, the first connection structure 350 is formed in the first trench 355t and may be in contact with the pixel separation pattern 120 in the light-shielding region OB. In some embodiments, the first connection structure 350 may extend along the profiles of the side surfaces and the lower surface of the first trench 355t.

In some embodiments, the first connection structure 350 may be electrically connected to the conductive filling pattern 122 to apply a ground voltage or a negative voltage to the conductive filling pattern 122. Accordingly, the electric charges generated by ESD or the like can be discharged to the first connection structure 350 through the conductive filling pattern 122, and a ESD bruise defect may be prevented.

The second connection structure 450 may be formed in the connection region CR. The second connection structure 450 may be formed on the surface insulating film 140 of the connection region CR. For example, the second connection structure 450 may penetrate the surface insulating film 140 of the connection region CR. The second connection structure 450 may electrically connect the first substrate 110 and the second substrate 210 to each other. For example, a second trench 455t that exposes the second wiring 134 and the fourth wiring 234 may be formed inside the first substrate 110, the first wiring structure IS1 and the second wiring structure IS2 of the connection region CR. The second connection structure 450 may be formed in the second trench 455t to connect the second wiring 134 and the fourth wiring 234. In some embodiments, the second connection structure 450 may extend along the profile of the side surfaces and the lower surface of the second trench 455t.

A third connection structure 550 may be formed inside the pad region PR. The third connection structure 550 may be formed on the surface insulating film 140 of the pad region PR. For example, the third connection structure 550 may penetrate the surface insulating film 140 of the pad region PR. The third connection structure 550 may electrically connect the second substrate 210 to an external device or the like.

For example, a third trench 550t that exposes a fifth wiring 236 may be formed inside the first substrate 110, the first wiring structure IS1, and the second wiring structure IS2 of the pad region PR. The third connection structure 550 may be formed in the third trench 550t and be in contact with the fifth wiring 236. Further, a fourth trench 555t may be formed inside the first substrate 110 of the pad region PR. The third connection structure 550 may be formed in the fourth trench 555t and exposed. In some embodiments, the third connection structure 550 may extend along the profiles of the side surfaces and the lower surface of the third trench 550t and the fourth trench 555t.

The first connection structure 350, the second connection structure 450 and the third connection structure 550 may include, but are not necessarily limited to, for example, at least one of titanium (Ti), titanium nitride (TiN), tantalum (Ta), tantalum nitride (TaN), tungsten (W), aluminum (Al), copper (Cu), and combinations thereof. In some embodiments, the first connection structure 350, the second connection structure 450, and the third connection structure 550 may be formed at the same level as each other. As used herein, the term "same level" means a level formed by the same fabricating process, and not necessarily disposed at the same vertical height.

In some embodiments, a first pad 355 that fills the first trench 355t may be formed on the first connection structure 350. In some embodiments, a second pad 555 that fills the fourth trench 555t may be formed on the third connection structure 550. The first pad 355 and the second pad 555 may include, but are not necessarily limited to, for example, at least one of tungsten (W), copper (Cu), aluminum (Al), gold (Au), silver (Ag), and alloys thereof. In some embodiments, the first pad 355 and the second pad 555 may be formed at the same level as each other.

In some embodiments, a first filling insulating film 460 that fills the second trench 455t may be formed on the second connection structure 450. In some embodiments, a second filling insulating film 560 that fills the third trench 550t may be formed on the third connection structure 550. The first filling insulating film 460 and the second filling insulating film 560 may each include, but are not necessarily limited to, for example, at least one of silicon oxide, aluminum oxide, tantalum oxide, and a combination thereof. In some embodiments, the first filling insulating film 460 and the second filling insulating film 560 may be formed at the same level as each other.

In some embodiments, the first protective film 160 may cover the first connection structure 350, the first pad 355, the second connection structure 450, and the third connection structure 550. For example, the first protective film 160 may extend conformally along the profiles of the first connection structure 350, the first pad 355, the second connection structure 450, and the third connection structure 550. In some embodiments, the first protective film 160 may expose the second pad 555. For example, the first protective film 160 may not be disposed on the second pad 555.

The element separation pattern 115 may be formed inside the first substrate 110. For example, an element separation trench 115t may be formed inside the first substrate 110. The element separation pattern 115 may be formed inside the element separation trench 115t. In some embodiments, the element separation pattern 115 may extend from the first face 110a of the first substrate 110 towards the second face 110b of the first substrate 110. In some embodiments, the element separation pattern 115 may be spaced apart from the second face 110b of the first substrate 110.

Although FIG. 15 illustrates an example in which the element separation pattern 115 is formed around the second connection structure 450 of the connection region CR and around the third connection structure 550 of the pad region PR, this is only an example. For example, the element separation pattern 115 may be formed around the first connection structure 350 in the light-shielding region OB.

The element separation pattern 115 may include, but is not necessarily limited to, for example, at least one of silicon oxide, silicon nitride, silicon oxynitride, aluminum oxide, hafnium oxide, and combinations thereof. In some embodiments, the element separation pattern 115 may be formed at the same level as the surface insulating film 140.

A light-shielding filter 270C may cover at least a part of the light-shielding region OB. For example, the light-shielding filter 270C may be formed on the first connection structure 350 and the second connection structure 450. The light-shielding filter 270C may include, but is not necessarily limited to, for example, a blue color filter.

The third protective film 380 may be formed on the light-shielding filter 270C. For example, the third protective film 380 may cover a part of the first protective film 160 in the light-shielding region OB, the connection region CR and the pad region PR. In some embodiments, the second protective film 185 may extend along the surface of the third protective film 380. The third protective film 380 may include, but is not necessarily limited to, for example, a light-transmitting resin. In some embodiments, the third protective film 380 may include the same material as the microlens 180.

In some embodiments, the second protective film 185 and the third protective film 380 may expose the second pad 555. For example, an exposure opening ER that exposes the second pad 555 may be formed inside the second protective film 185 and the third protective film 380. As a result, the exposure opening ER may allow the second pad 555 to connect to an external device or the like to transmit and receive electrical signals between the image sensor and the external device. That is, the second pad 555 may be an I/O pad of the image sensor according to some embodiments.

An image sensor according to the present disclosure may have unit pixels with light-receiving areas of varying sizes to correct for a difference in red-green and blue-green ratios of light received at the center of the image sensor and red-green and blue-green ratios of light received at the periphery of the image sensor. Accordingly, a shading phenomenon may be reduced and the quality of the resulting image may be increased.

In concluding the detailed description, those skilled in the art will appreciate that many variations and modifications may be made to the preferred embodiments without substantially departing from the principles of the present inventive concept. Therefore, the disclosed preferred embodiments of the disclosure are used in a generic and descriptive sense only and not for purposes of limitation.

What is claimed is:

1. An image sensor comprising:
   a light receiving region including a plurality of pixels;
   a first region including, from among the plurality of unit pixels, unit pixels adjacent to a center of the light-receiving region; and
   a second region including, from among the plurality of unit pixels, unit pixels spaced apart from the center of the light-receiving region, wherein the second region is further from the center of the light-receiving region than the first region,
   wherein both the first region and the second region include:
   a substrate which includes a first face on which light is incident, and a second face opposite to the first face,
   a plurality of photoelectric conversion layers disposed in the substrate and corresponding to the plurality of unit pixels,
   a pixel separation pattern extending from the second face to the first face in the substrate separating photoelectric conversion layers from the plurality of photoelectric conversion layers from each other,
   a plurality of color filters disposed on the first face of the substrate and corresponding to the plurality of unit pixels, and
   a grid pattern disposed on the first face of the substrate and interposed between color filters from the plurality of color filters,
   wherein a width of the grid pattern in the second region is greater than a width of the grid pattern in the first region.

2. The image sensor of claim 1, wherein a light-receiving area of each of the color filters of the second region is smaller than a light-receiving area of each of the color filters of the first region.

3. The image sensor of claim 1, wherein the plurality of color filters includes a first color pattern, and a second color pattern, wherein the second color pattern is arranged along a first direction with the first color pattern and is different from the first color pattern, and
   wherein a light-receiving area of the first color pattern of the second region is smaller than a light-receiving area of the first color pattern of the first region, and wherein the light-receiving area of the first color pattern of the second region is also smaller than a light-receiving area of the second color pattern of the second region.

4. The image sensor of claim 3, wherein the first color pattern is a red color filter or a blue color filter, and the second color pattern is a green color filter.

5. The image sensor of claim 3, wherein a light-receiving area of the second color pattern of the second region is the same size as a light-receiving area of the second color pattern of the first region.

6. The image sensor of claim 3, wherein the plurality of color filters further includes a third color pattern which is arranged proximate to the second color pattern along a second direction intersecting the first direction, and is different from the first color pattern and the second color pattern, and
   wherein a light-receiving area of the third color pattern in the second region is smaller than a light-receiving area of the third color pattern in the first region, and wherein the light-receiving area of the third color pattern in the second region is also smaller than a light-receiving area of the second color pattern of the second region.

7. The image sensor of claim 1, wherein a width of the pixel separation pattern decreases as the pixel separation pattern's distance from the second face increases.

8. The image sensor of claim 1, wherein the pixel separation pattern includes a conductive filling pattern, and an insulating spacer film separating the conductive filling pattern from the substrate.

9. The image sensor of claim 8, wherein the conductive filling pattern includes polysilicon.

10. The image sensor of claim 1, further comprising:
    an electronic element disposed on the second face of the substrate, and
    a wiring structure electrically connected to the electronic element.

11. An image sensor with a light-receiving region including a plurality of unit pixels, the image sensor comprising:
    a first region including, from among the plurality of unit pixels, unit pixels adjacent to a center of the light-receiving region; and
    a second region including, from among the plurality of unit pixels, unit pixels spaced apart from the center of the light-receiving region, wherein the second region is further from the center of the light-receiving region than the first region,
    wherein both the first region and the second region include both a first color pattern and a second color pattern adjacent to and different from the first color pattern,
    and wherein a light-receiving area of the first color pattern in the second region is smaller than a light-receiving area of the first color pattern in the first region, and
    wherein a light-receiving area of the first color pattern in the second region is smaller than a light-receiving area of the second color pattern of the second region.

12. The image sensor of claim 11, wherein each of the first region and the second region further includes a grid pattern interposed between the first color pattern and the second color pattern, and wherein a width of the grid pattern of the second region is greater than a width of the grid pattern of the first region.

13. The image sensor of claim 11, wherein each of the first region and the second region further includes a third color pattern adjacent to the second color pattern and different from both the first color pattern and the second color pattern, and wherein a light-receiving area of the third color pattern of the second region is smaller than a light-receiving area of the third color pattern of the first region, and wherein a light-receiving area of the third color pattern of the second region is smaller than a light-receiving area of the second color pattern of the second region.

14. The image sensor of claim 13, wherein the first color pattern and the second color pattern are arranged along a first direction, and wherein the second color pattern and the third color pattern are arranged along a second direction intersecting the first direction.

15. The image sensor of claim 14, wherein the first color pattern is a red color filter, the second color pattern is a green color filter, the third color pattern is a blue color filter.

\* \* \* \* \*